United States Patent [19]

Azar

[11] Patent Number: 5,067,047

[45] Date of Patent: Nov. 19, 1991

[54] CIRCUIT PACK WITH INBOARD JET COOLING

[75] Inventor: Kaveh Azar, Westwood, Mass.

[73] Assignee: AT&T Bell Laboratories, Murray Hill, N.J.

[21] Appl. No.: 522,290

[22] Filed: May 11, 1990

[51] Int. Cl.$^5$ .............................................. H05K 7/20
[52] U.S. Cl. ................................... 361/384; 165/908; 361/405; 428/901
[58] Field of Search ...................... 174/16.1, 15.1, 252; 62/414, 418; 357/81; 165/122, 185, 908, 104.33, 104.34, 80.2–80.5; 361/382–385, 415, 400, 405, 412, 414; 211/41; 428/901

[56] References Cited

U.S. PATENT DOCUMENTS

| | | |
|---|---|---|
| 2,445,852 | 7/1948 | Melville . |
| 3,626,251 | 12/1971 | Vigue . |
| 4,277,816 | 7/1981 | Dunn et al. . |
| 4,399,484 | 8/1983 | Mayer . |
| 4,498,118 | 2/1985 | Bell . |
| 4,614,389 | 9/1986 | Albert et al. . |
| 4,674,004 | 6/1987 | Smith et al. . |
| 4,734,315 | 3/1988 | Spence-Bate .................. 361/384 |
| 4,739,443 | 4/1988 | Singhdes ........................ 361/385 |
| 4,774,630 | 9/1988 | Reisman ........................ 361/383 |
| 4,839,774 | 6/1989 | Hamburgen ................... 361/383 |
| 4,851,965 | 7/1989 | Gabuzda et al. . |
| 4,962,444 | 10/1990 | Nissemann .................... 361/382 |

FOREIGN PATENT DOCUMENTS 1105068  3/1968  United Kingdom ............... 361/388

*Primary Examiner*—Gerald P. Tolin
*Attorney, Agent, or Firm*—L. H. Birnbaum

[57] ABSTRACT

Disclosed is a means for cooling heat generating components mounted on the front surface of printed circuit boards. A conduit member is attached to the back surface of the board to form a sealed plenum and to provide direction of cooling fluid toward the components. Holes in the board establish cooling jets directed at the components from the plenum.

12 Claims, 5 Drawing Sheets

CIRCUIT PACK WITH INBOARD JET COOLING

BACKGROUND OF THE INVENTION

The reliability of electronic equipment has always been associated with the operating temperatures of its components. In general, the higher the temperature the less reliable the component. For many components, temperatures above fairly well established ranges can be disastrous.

With modern integrated circuits and printed wiring board circuit packs, component density has again reached the point where additional cooling is required.

Many cooling schemes already exist, left over from the days of vacuum tubes and discrete transistors (see, e.g., U.S. Pat. Nos. 3,626,251 issued to Vigue, and 2,445,582 issued to Melville). Some of these require expensive refrigerating equipment and/or extensive space taken from the printed wiring boards. Some of the more recent proposals require separate plenums mounted above the components on printed circuit boards (see, e.g., U.S. Pat. Nos. 4,851,965 issued to Gabuzda, 4,277,816 issued to Dunn et al, 4,674,004 issued to Smith et al, and 4,498,118 issued to Bell). At least one recent proposal has shown the possibility of directing coolant through a hole in a board toward the bottom surface of a component (see U.S. Pat. No. 4,399,484 issued to Mayer).

An object of this invention is to provide a cooling system for electronic circuit packs that is simple, relatively inexpensive, and uses almost no space on the circuit board.

SUMMARY OF THE INVENTION

This and other objects are achieved in accordance with the invention which is a fluid-cooled circuit pack comprising a circuit board having front and back major surfaces with at least one heat generating component mounted on the front surface. The circuit pack also includes conduit means connectable to a source of compressed fluid and attached to the back surface of the circuit board to form a sealed plenum for conducting cooling fluid in a direction essentially parallel to said surfaces to a predetermined area of the back surface of the board. At least one hole extends from the back surface to the front surface in the vicinity of said component to form a cooling jet when the conduit means is connected to the source.

DETAILED DESCRIPTION

Figure 1:
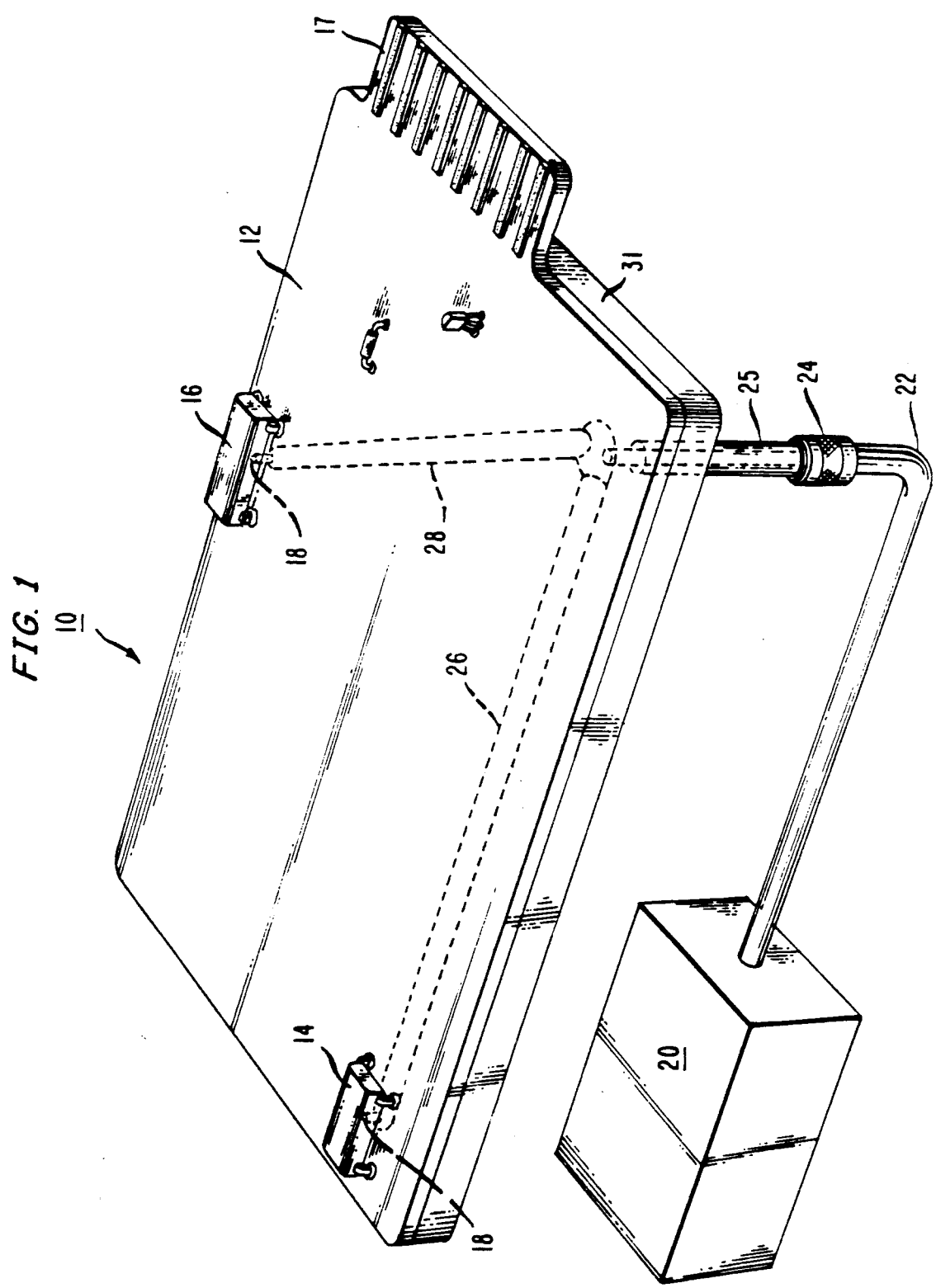
FIG. 1 is a three-dimensional view of an embodiment of the invention using surface mount technology.

In the embodiment of FIG. 1, a circuit pack 10 may have all of its components and wiring mounted on its front side 12. Among the many components may be, for example, an integrated circuit 14 and a capacitor 16 that require cooling. A projection 17 on one edge of the circuit pack may contain gold or silver plated "fingers" for plugging into a matching socket in a well-known manner to provide the electrical circuit connections to and from the circuit pack. The desired cooling may be accomplished according to the invention with the aid of one or more small holes 18 that exit the circuit board beneath the targeted component. Pressurized cooling fluid, which in the simplest case can be compressed air, is supplied through holes 18 via a pump 20, hose 22, connector 24, tube 25, and tunnels 26 and 28 carved in the surface opposite to the front surface 12 including the components. Holes 18 are orifices judiciously placed to form fluid jets impinging upon the desired areas of the respective components. The orifices may be of various shapes such as, for example, round, rectangular or triangular, to optimize ease of manufacture or the physical characteristics of the created fluid jets. In addition, the orifices may be perpendicular to, or alternatively at an oblique angle to, the surface 12 of the board. In this manner components may be cooled by a broad, almost uniform flow of fluid or the flow may be concentrated on a particular hot spot. In some instances the jets may be aimed to enhance convection without actually impinging directly upon any component.

Figure 2:
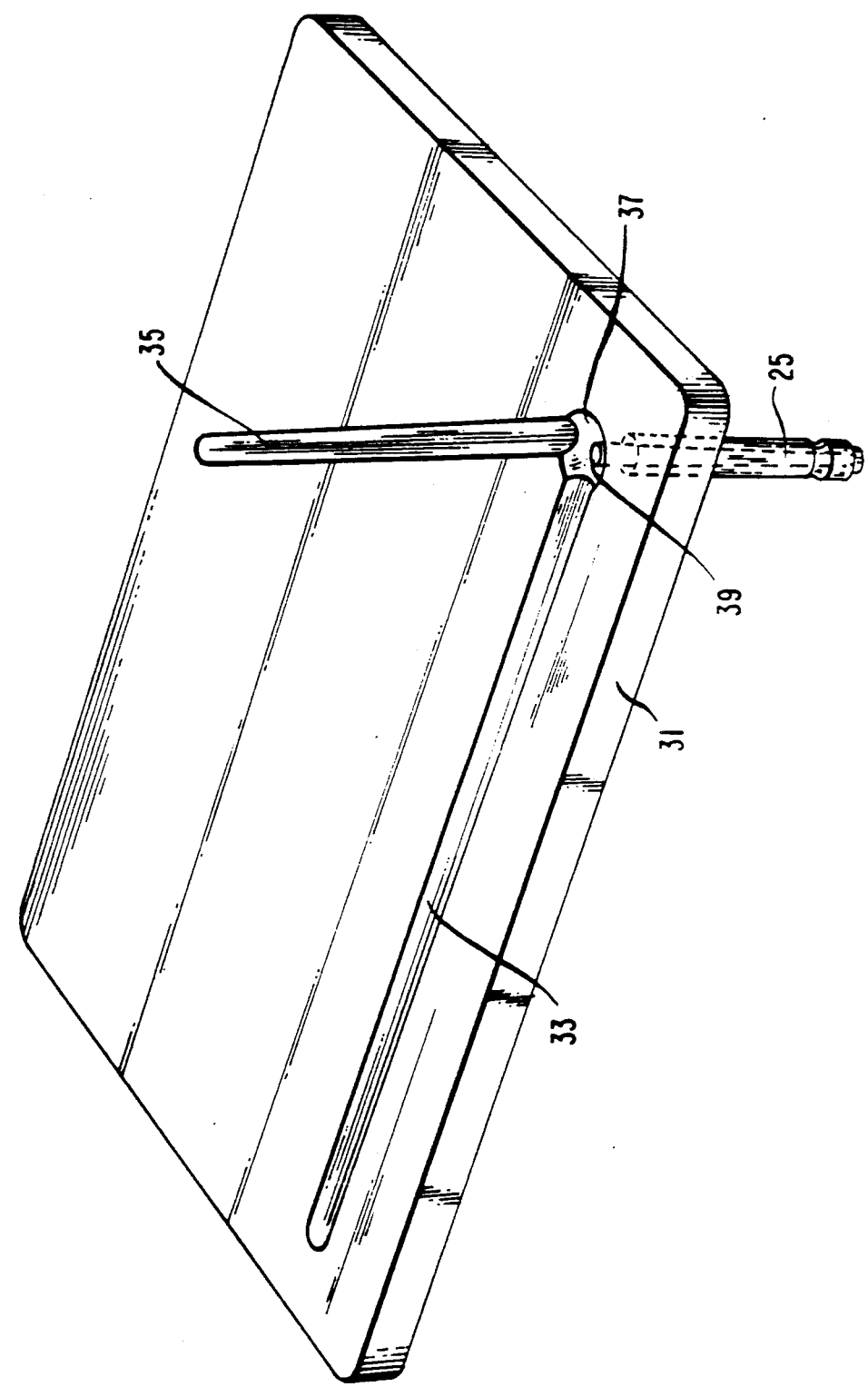
FIG. 2 is a view of a part useful in producing the embodiment of FIG. 1.

When the embodiment of FIG. 1 is made from a printed wiring board that uses surface mount technology, the back side of the board is typically smooth. This allows inboard jet cooling according to the invention with the addition of the board 31 shown in more detail in FIG. 2. In this view, the solid board 31 which is typically glass epoxy or metal, may have machined or molded in the top side thereof a pair of tunnels 33 and 35 which mate with the tunnels 26 and 28 to form plenums and which intersect in an area 37. A tubular fitting 39 may be attached to area 37 and extend through the back side of board 31. Board 31 is, therefore, attached to the back side of board 12 to form the circuit pack 10 of FIG. 1. The attachment process should provide an airtight seal to avoid wasting pressurized fluid and creating uncontrolled fluid flow. Epoxy glue and hot plastic bonding are examples of processes that may be used. In this embodiment, the plenums formed by tunnels 26 and 28 and grooves 33 and 35 supply the compressed fluid to orifices 18.

Very substantial component cooling can be effected with a source of compressed air in the range 1.38 to $4.14 \times 10^5$ pa, and circular orifices in the order of 0.025 to 0.254 cm in diameter. In addition to the reduction of heat caused by the substantial flow of fluid across the heat generating components, adiabatic expansion of the fluid between the orifice and the component reduces the fluid temperature to provide additional cooling. Since the cooling jets may be very small, depending upon the number of cooling jets to be supplied, the inboard plenum can be surprisingly narrow and still supply a sufficient quantity of fluid.

Figure 3:
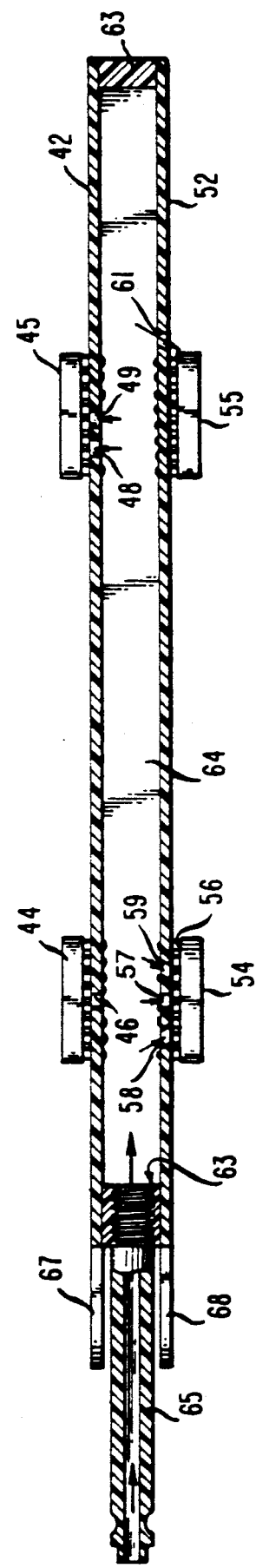
FIG. 3 is a cross-sectional view of an embodiment using two conventional printed wiring boards.

A particularly useful embodiment of the invention that can be made from printed wiring boards that use conventional thru-hole technology is shown in the cross-sectional in FIG. 3. In this embodiment a first printed wiring board 42 may have mounted thereon via thru-hole technology, for example, components 44 and 45 that require cooling. In order to serve particular cooling needs, a single orifice 46 may be located under component 44, and two orifices, 48 and 49, may be located under component 45. Similarly, a printed circuit board 52 may have components 54 and 55 mounted thereon. Component 54 may require a large amount of cooling at a particular hot spot 56. Accordingly, board 52 may have a perpendicular hole 57 and oblique holes 58 and 59 therethrough. Component 55, for example, may normally develop a hot spot on its end. An oblique hole 61 through board 52 may be located to provide the appropriately directed fluid jet. Boards 42 and 52 are joined into a single circuit pack by a spacer 63 to form a plenum chamber 64 of virtually the entire space between the two boards. A pipe-threaded fitting 65 attached to spacer 63 connects the plenum chamber to a source of pressurized fluid. To provide sufficient clearance for making the electrical and fluid connections to the circuit pack of FIG. 3, electrical connector projections 67 and 68 may be offset with respect to the fitting 65 (i.e., at different depths behind the viewed cross-section plane).

Figure 4:
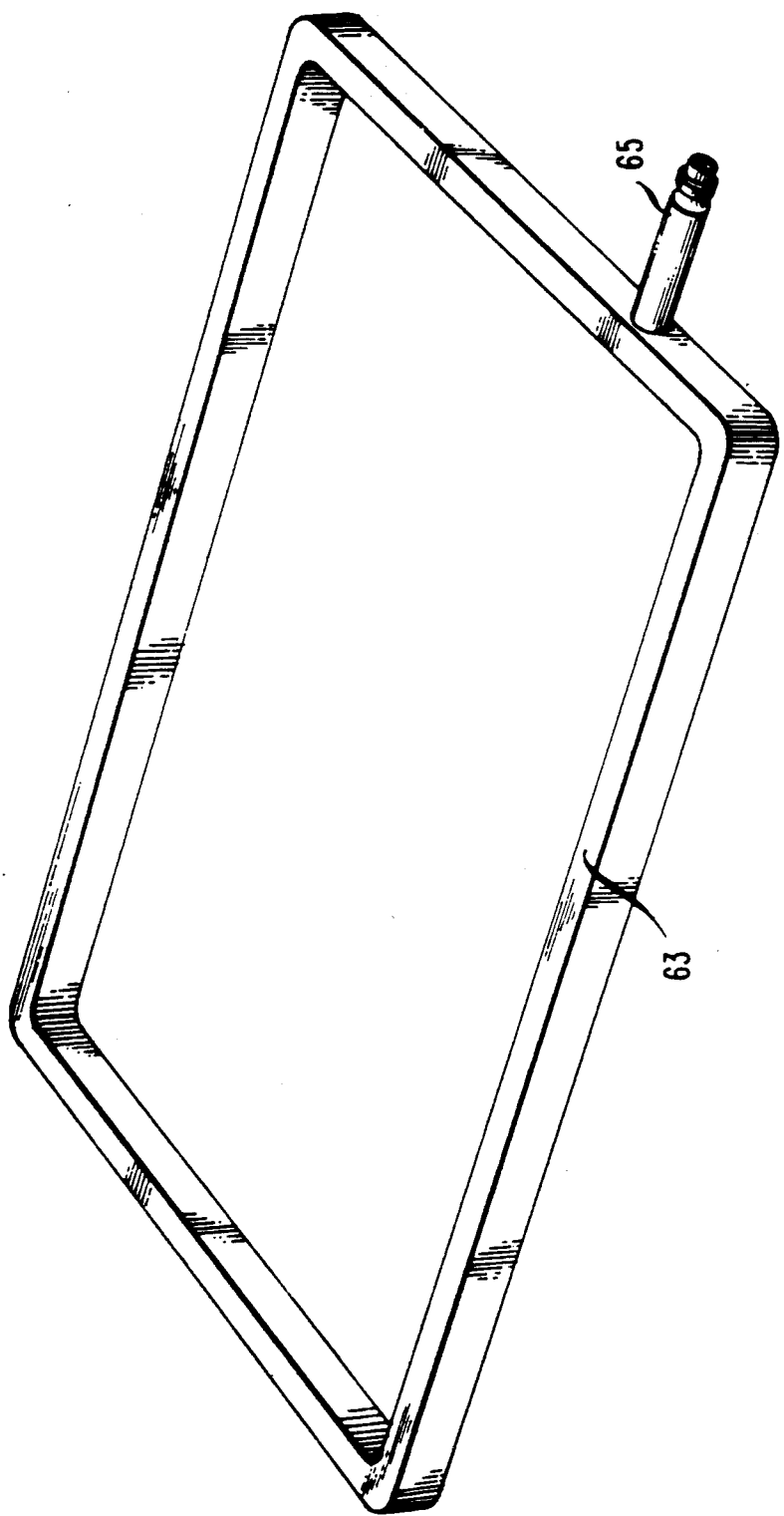
FIG. 4 is a view of a part useful in producing the embodiment of FIG. 3.

FIG. 4 is a three-dimensional view of spacer 63. Fluid connector 65 may conveniently be part of a well-known quick connect compressed air fitting. As in the case of the embodiment of FIG. 1, spacer 63 should be attached to the back sides of boards 42 and 52 in an airtight manner. Since the periphery of each board is normally component-free, there should be no projections of wire or solder to impede the process.

Figure 5:
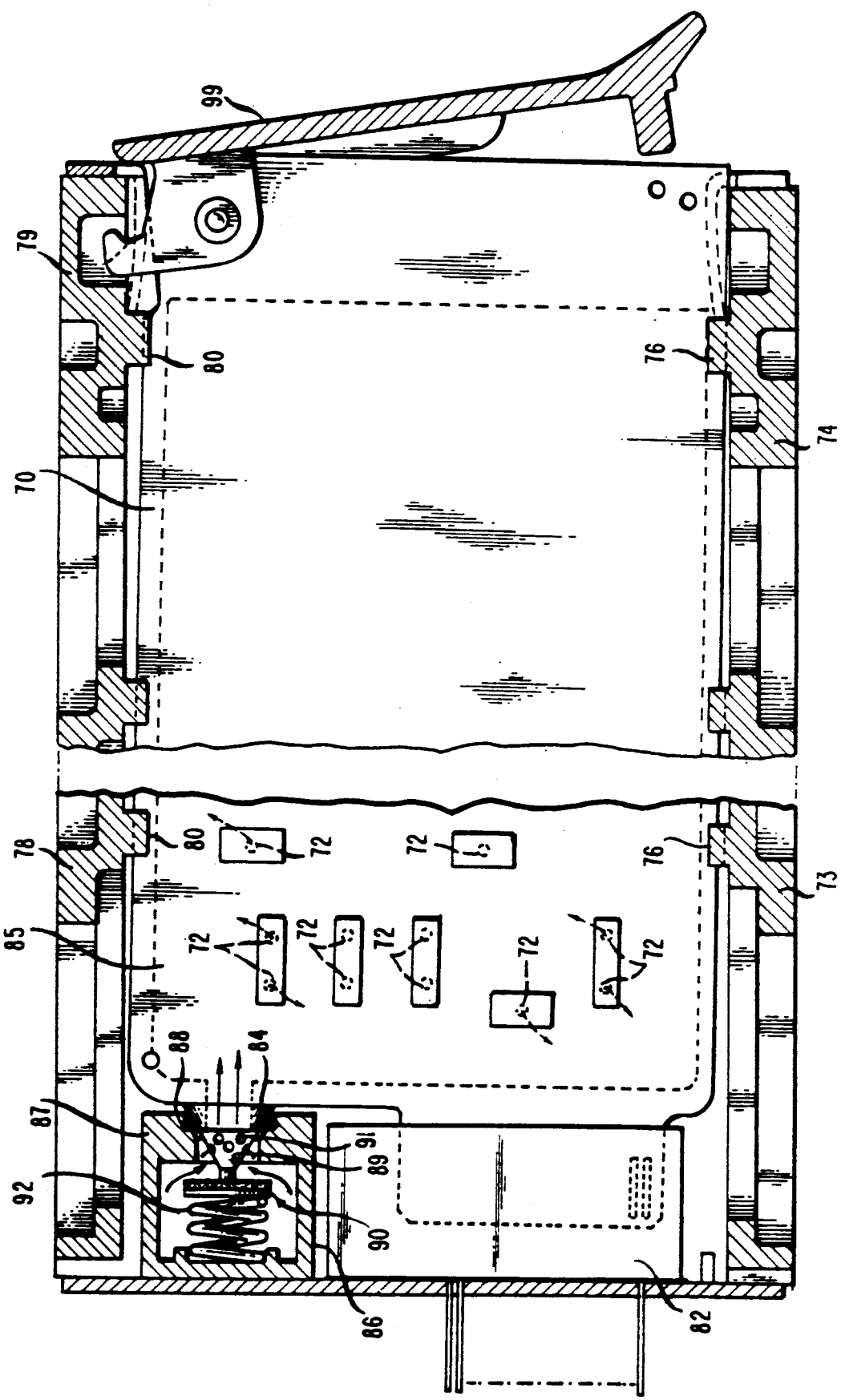
FIG. 5 is a partly cross-sectional view of an embodiment that may be plugged into an equipment shelf.

An embodiment of a circuit pack according to the invention that conveniently can be inserted and removed from an equipment shelf containing many circuit packs will be described with reference to FIG. 5. In this illustration, the equipment shelf is shown in cross-section, cut by a plane a short distance in front of the circuit pack. A circuit pack 70 having inboard cooling jets 72 according to the invention rests on shelf rails 73 and 74. A pair of projections 76 on each rail 73 and 74 form a channel to guide the circuit pack into and out of the equipment. Similarly, a pair of rails 78 and 79 with projections 80 may guide the top of circuit pack 70 and hold it in a vertical position. A backplane socket 82 receives the "gold fingers" of the circuit pack in a conventional manner to make the electrical connection between the circuit pack and the equipment backplane wiring. A conical nozzle 84 at the edge of the circuit pack 70 forms an inlet to the internal plenum 85 of the circuit pack.

To provide the compressed fluid for cooling according to the invention, the equipment backplane may also include an external plenum chamber 86, shown in cross-section in a plane through the center of nozzle 84. Plenum chamber 86 may have one or more cylindrical output ports 87. An O ring 88 forms a compression seal between nozzle 84 and port 87. A valve 90, in the center of each port, normally held closed to avoid fluid leakage by a spring 92, is forced open by the force of nozzle 84 on funnel-shaped member 89. The opening of valve 90 thereby permits the escape of cooling fluid through the perforations 91 of the funnel member into the nozzle 84 and plenum 85. Finally, a locking lever 99, pivotally connected to circuit pack 70 can bear against rail 79 to force circuit pack 70 in place and hold it there against the resistance of socket 82, valve 90, O ring 88 and the pressurized cooling fluid. (For more details on a latching assembly which may be utilized with the present invention, see U.S. Pat. No. 4,614,389 issued to Albert, which is incorporated by reference herein.) With an equipment shelf thus equipped, circuit packs 70 with inboard jet cooling according to the invention can be inserted and removed conveniently without undue disturbance.

There have thus been described novel arrangements for providing effective cooling of circuit pack components. Those skilled in the art will readily perceive other variations that are nevertheless within the scope and spirit of the invention.

I claim:

1. A fluid-cooled circuit pack comprising:
   a circuit board having front and back major surfaces with at least one heat generating component mounted on the front surface;
   conduit means connectable to a source of compressed fluid and attached to the back surface of said circuit board to form a sealed plenum for conducting cooling fluid in a direction essentially parallel to said surfaces to a predetermined area at the back surface of said board; and
   at least one hole in said circuit board connected to said conduit means, said hole extending from the back surface to the front surface in sufficient proximity to said component to form a cooling jet impinging on said component when said conduit means is connected to said source.

2. The circuit pack according to claim 1 wherein a plurality of holes is formed in said circuit board in the vicinity of said component to form a plurality of jets directed to said component.

3. The circuit pack according to claim 2 wherein at least one of said holes is oriented at an oblique angle to the front and back surfaces of the board.

4. The circuit pack according to claim 1 further comprising a source of compressed fluid connected to said conduit means.

5. The circuit pack according to claim 4 wherein the fluid is air.

6. The circuit pack according to claim 1 wherein the at least one hole is circular and has a diameter in the range 0.0254 to 0.254 cm.

7. The circuit pack according to claim 4 wherein the source of compressed air has a pressure in the range 1.38 to $4.14 \times 10^5$ pa.

8. The circuit pack according to claim 1 wherein the conduit means comprises a second circuit board mounted in a parallel spaced relationship with said first board.

9. The circuit pack according to claim 1 wherein the conduit means comprises a second board mounted adjacent to the back surface of the circuit board and including channels formed in the surface of the second board adjacent to the circuit board for directing the flow of fluid to said predetermined area.

10. The circuit pack according to claim 1 further comprising means for connecting the conduit means to the source of compressed fluid through an edge of the conduit means which is perpendicular to the front and back surfaces of the circuit board.

11. The circuit pack according to claim 10 where the means for connecting the conduit means comprises a nozzle which fits into a plenum formed on a backplane when the circuit pack is inserted in a shelf extending perpendicular to the backplane.

12. The circuit pack according to claim 1 further comprising means for connecting the conduit means to the source of compressed fluid through a surface of the conduit means which is essentially parallel to the front and back surfaces of the circuit board.

* * * * *